(12) United States Patent
Huang et al.

(10) Patent No.: US 12,392,700 B2
(45) Date of Patent: Aug. 19, 2025

(54) GAS DENSITY RELAY WITH ONLINE SELF-CHECKING FUNCTION, AND CHECKING METHOD THEREFOR

(71) Applicant: SHANGHAI ROYE ELECTRIC CO., LTD., Shanghai (CN)

(72) Inventors: Xiaobeng Huang, Shanghai (CN); Jin Chen, Shanghai (CN); Min Chang, Shanghai (CN); Tiexin Xia, Shanghai (CN); Haiyong Jin, Shanghai (CN)

(73) Assignee: SHANGHAI ROYE ELECTRIC CO., LTD., Shanghai (CN)

( * ) Notice: Subject to any disclaimer, the term of this patent is extended or adjusted under 35 U.S.C. 154(b) by 407 days.

(21) Appl. No.: 17/997,545

(22) PCT Filed: Feb. 9, 2021

(86) PCT No.: PCT/CN2021/076135
§ 371 (c)(1),
(2) Date: Oct. 29, 2022

(87) PCT Pub. No.: WO2021/218289
PCT Pub. Date: Nov. 4, 2021

(65) Prior Publication Data
US 2023/0160800 A1    May 25, 2023

(30) Foreign Application Priority Data
Apr. 29, 2020    (CN) .......................... 202010354510.4

(51) Int. Cl.
*G01L 7/04*    (2006.01)
*G01N 9/26*    (2006.01)
(Continued)

(52) U.S. Cl.
CPC ........... *G01N 9/266* (2013.01); *G01R 31/327* (2013.01); *H01H 35/26* (2013.01); *H01H 35/32* (2013.01)

(58) Field of Classification Search
CPC .... G01L 7/04–048; G01N 9/00; G01N 9/266; G01R 31/327; G01R 31/3271; H01H 33/563; H01H 35/26; H01H 35/32
See application file for complete search history.

(56) References Cited

U.S. PATENT DOCUMENTS

| 3,973,094 A | 8/1976 | Kuhn |
| 2019/0011059 A1* | 1/2019 | Lippert .................. G01L 7/043 |

FOREIGN PATENT DOCUMENTS

| CN | 110988667 A | 4/2020 |
| CN | 111029211 A | 4/2020 |
| CN | 111446111 A | 7/2020 |

* cited by examiner

*Primary Examiner* — Alexander A Mercado
(74) *Attorney, Agent, or Firm* — Hsuanyeh Law Group, PC

(57) ABSTRACT

The application provides a gas density relay with online self-check function and its check method, which are used for high voltage and medium-voltage electrical equipment. The gas density relay includes a gas density relay body, a first pressure sensor, a temperature sensor, a force measuring sensor, a driving contact action mechanism and an intelligent control unit. The driving contact action mechanism is configured to directly or indirectly drive the signal action mechanism of the gas density relay body to displacement, so that the gas density relay body will have contact signal action. The intelligent control unit will detect the alarm and/or blocking contact signal action value and/or return value of the gas density relay body according to the density value when the contact acts. Checking the gas density relay can be completed without maintainer coming to the site, (Continued)

which improves the reliability of the power grid, improves the efficiency, reduces the operation and maintenance cost, and can implement the maintenance free of the gas density relay.

20 Claims, 2 Drawing Sheets

(51) Int. Cl.
*G01R 31/327* (2006.01)
*H01H 35/26* (2006.01)
*H01H 35/32* (2006.01)

GAS DENSITY RELAY WITH ONLINE SELF-CHECKING FUNCTION, AND CHECKING METHOD THEREFOR

RELATED APPLICATIONS

This is a US national stage application of international application no. PCT/CN2021/076135, which claims the priority of the Chinese patent application with application Number 202010354510.4 (Title: a gas density relay with online self-check function and its check method) filed on Apr. 29, 2020.

TECHNICAL FIELD

The invention relates to the field of electric power technology, in particular to a gas density relay with online self-check function and its check method applied to high-voltage and medium-voltage electrical equipment.

BACKGROUND

With the development of unattended substations towards networking and digitalization, and the increasing requirements for remote control and telemetry, online monitoring of gas density and micro water content of SF6 electrical equipment has important practical significance. With the continuous development of China's intelligent grid, intelligent high-voltage electrical equipment, as an important component and key node of intelligent substation, plays a pivotal role in the security of intelligent grid. At present, most high-voltage electrical equipment are SF6 gas insulated equipment. If the gas density decreases (caused by leakage, etc.), it will seriously affect the electrical performance of the equipment and cause serious hidden dangers for safe operation. At present, online monitoring of gas density in SF6 high-voltage electrical equipment has been very common, so the application of gas density monitoring system (gas density relay) will flourish. The current gas density monitoring system (gas density relay) is basically: 1) the remote SF6 gas density relay is used to collect and upload the density, pressure and temperature, so as to implement the online monitoring of gas density; 2) The gas density transmitter is used to collect and upload the density, pressure and temperature, so as to implement the online monitoring of gas density. SF6 gas density relay is the core and key component.

Regular inspection of gas density relay on electrical equipment is a necessary measure to prevent problems before they occur and ensure safe and reliable operation of electrical equipment. Both the Electric Power Preventive Test Code and the Twenty-five Key Requirements for Preventing Major Accidents in Electric Power Production require that the gas density relay be checked regularly. From the actual operation, regular check of gas density relay is one of the necessary means to ensure the safe and reliable operation of power equipment. Therefore, at present, checking gas density relay has been attached great importance and popularized in the power system, and has been implemented by power supply companies, power plants, and large factories and mining enterprises. Power supply companies, power plants and large factories and mining enterprises need to equip testers, equipment vehicles and high-value SF6 gas to complete the on-site check and detection of gas density relays. Including the outage operating loss during detection, roughly calculated, the annual shared detection cost of each high-voltage switch station is about tens of thousands to hundreds of thousands of yuan. In addition, if the on-site check of the inspectors is not standardized, there are potential safety hazards. Therefore, it is very necessary to innovate in the existing gas density self-check gas density relay, especially the gas density online self-check gas density relay or system, so as to implement the check function of the gas density relay for online gas density monitoring or the monitoring system composed of the gas density relay, thus completing the regular check of the (mechanical) gas density relay without the need for maintainer to go to the site, To improve work efficiency and reduce operation and maintenance costs.

SUMMARY

The invention aims to provide a gas density relay (or gas density monitoring device) with online self-check function and its check method to solve the problems raised in the above technical background.

To achieve the above purpose, the invention adopts the following technical solutions:

The first aspect of the application provides a gas density relay with online self-check function, including: a gas density relay body, a first pressure sensor, a temperature sensor, a force measuring sensor, a driving contact action mechanism and an intelligent control unit;

The gas density relay body comprises a housing, a pressure detection element, a temperature compensation element, a signal generator and a signal action mechanism arranged in the housing;

The first pressure sensor is connected to the pressure detection element of the gas density relay body;

The driving contact action mechanism is arranged inside or outside the shell, and includes a force application mechanism and a motion mechanism. The force application mechanism includes a driving component and a force transmission component driven by the driving component. The motion mechanism includes a push rod, which moves under the drive of the force application mechanism, directly or indirectly displaces the signal action mechanism to trigger the signal generator to generate contact signal action;

The force measuring sensor, which is arranged on the driving contact action mechanism or in the housing, is configured to detect the force exerted by the driving contact action mechanism on the gas density relay body;

The intelligent control unit is respectively connected to the driving contact action mechanism, the first pressure sensor, the temperature sensor and the force measuring sensor, and is configured to complete the control of the driving contact action mechanism, pressure value acquisition and temperature value acquisition, and/or gas density value acquisition, or/and detect the contact signal action value and/or contact signal return value of the gas density relay body;

Wherein, the contact signal includes alarm and/or blocking.

The above gas density relay with online self-check function refers to the integral structure of its components; The gas density monitoring device with the function of online self-check refers to its component design, component structure and flexible composition.

Preferably, the signal generator includes a microswitch or a magnetic assisted electrical contact, and the gas density relay body outputs a contact signal through the signal generator.

Preferably, the temperature compensation element adopts a temperature compensation sheet or a gas enclosed in the housing.

Preferably, the pressure detecting element comprises a bourdon tube or a corrugated tube.

Preferably, the force measuring sensor includes one of gravity sensor, pressure sensor, magnetic sensor, displacement sensor, shape variable sensor, photoelectric sensor, angle sensor and camera.

Preferably, the driving components include one of magnetic driving mechanism, gravity, motor, reciprocating mechanism, Carnot circulation mechanism, air compressor, compressor, vent valve, pressure making pump, booster pump, booster valve, electric air pump, electromagnetic air pump, pneumatic element, magnetic coupling thrust mechanism, heating thrust generation mechanism, electric heating thrust generation mechanism, and chemical reaction thrust generation mechanism.

Preferably, the force transmitting member includes one of cam, connecting rod, spring, metal piece, non-metal piece, expansion piece and non-expansion piece.

Preferably, the force measuring sensor is arranged on the push rod driving the contact action mechanism; Alternatively, the force measuring sensor is arranged on the pressure detecting element; Alternatively, the force measuring sensor is arranged on the temperature compensation element; Alternatively, the force measuring sensor is arranged on the signal action mechanism.

Preferably, the gas density relay body also comprises a base, an end seat and a movement arranged in the housing; The movement is fixed on the base; The pressure detection element is a bourdon tube filled with sealing gas, one end of which is fixed on the base and connected to it, the other end is connected to one end of the temperature compensation element through the end seat, and the other end of the temperature compensation element is provided with a signal action mechanism; The signal action mechanism is provided with an adjusting screw or trigger to push the signal generator and make the contact of the signal generator connected or disconnected, and the gas density relay body outputs the contact signal through the signal generator; The driving contact actuating mechanism is arranged outside the shell of the gas density relay body, the driving contact actuating mechanism also includes a cover with an opening, the cover is fixedly connected to the shell, and the opening faces the shell, and the driving component, power transmission component and push rod are arranged inside the cover; Alternatively, the driving contact action mechanism is arranged in the housing of the gas density relay body.

More preferably, one end of the push rod towards the force application mechanism is provided with a fixing piece, the fixing piece is fixed in the housing, the other end of the push rod penetrates a fixing frame fixed at the opening of the housing, the end of the push rod penetrates the end of the fixing frame and extends into the housing from the air hole on the housing of the gas density relay body; The end seat in the housing is provided with an end seat contact plate, and the push rod extends into the end of the housing and is relatively arranged with the end seat contact plate.

Further, the force sensor is connected to the push rod through a contact, or the force sensor is directly connected to the push rod.

Further, a return spring is sleeved on the push rod between the fixing piece and the fixing frame.

Further, the force transmitting element is a cam, the end face on the cam opposite to the convex part of the cam contacts the end of the push rod toward the cam, and the return spring is in a naturally extended state; The driving component drives the cam to rotate, the convex part of the cam strikes the push rod, and drives the push rod to move along its axial direction. When the convex part of the cam leaves the push rod, the push rod resets under the elastic force of the reset spring.

More preferably, one end of the push rod towards the force application mechanism passes through a fixed frame which is fixedly arranged on the housing of the gas density relay body. After the end of the push rod far away from the force application mechanism extends from the opening of the housing, it extends into the housing through the air hole on the housing of the gas density relay body; The end part of the push rod extending into the housing is relatively arranged with the pressure detecting element in the housing.

Further, the force sensor contacts the pressure detection element through a contact piece, or the force sensor directly contacts the pressure detection element.

Further, a return spring is sleeved on the push rod between the fixed frame and the air hole.

Further, the force transmitting element is a cam, the end face on the cam opposite to the convex part of the cam contacts the end of the push rod toward the cam, and the return spring is in a naturally extended state; The driving component drives the cam to rotate, the convex part of the cam strikes the push rod, and drives the push rod to move along its axial direction. When the convex part of the cam leaves the push rod, the push rod resets under the elastic force of the reset spring.

More preferably, the movement comprises a sector gear and a central gear, the first end of the sector gear is meshed with the central gear, and the second end of the sector gear is connected to the other end of the temperature compensation element through a connecting rod or directly; The second end of the sector gear is fixedly connected to one end of the sector gear contact, and the other end of the sector gear contact extends out of the housing from the air hole of the housing of the gas density relay body, and is opposite to the end of the push rod driving the contact action mechanism away from the force application mechanism.

Furthermore, the force application mechanism exerts force on the sector gear contact through the push rod, the second end of the sector gear generates displacement, the first end of the sector gear meshing with the central gear drives the central gear to rotate, the central gear and the pointer are installed on the drive rod, and the rotation of the central gear drives the drive rod to rotate, so that the pointer movement is indicated on the dial.

Furthermore, the pointer is provided with a trigger, which is used to connect or disconnect the contact of the signal generator.

Furthermore, the force measuring sensor is arranged on the force application mechanism driving the contact action mechanism.

Preferably, the gas density relay body comprises a first corrugated pipe arranged in the housing as a pressure detection element, and also a second corrugated pipe. The first open end of the first corrugated pipe is fixed on the inner wall of the housing, the second open end of the first corrugated pipe is sealed with the first sealing element, and the inner wall of the first corrugated pipe, the first sealing element, and the inner wall of the housing are together enclosed into a first sealing gas chamber, The first sealing gas chamber is provided with an interface which is connected to the insulating gas of the electrical equipment; The first open end of the second corrugated pipe is sealed with the first sealing element, the second open end of the second corrugated pipe is connected to the inner wall of the housing through the second sealing element, the outer wall of the first corrugated pipe, the first sealing element, the outer wall of the second corrugated pipe, the second sealing element and the inner wall of the housing form a second sealing gas chamber, and the second sealing gas chamber is filled with standard compensation gas, constituting a temperature compensation element; The inner wall of the second corrugated pipe, the second sealing element and the inner wall of the shell form a third gas chamber together. The signal generator and signal action mechanism are arranged in the third gas chamber. The signal action mechanism is connected to the first sealing element. The signal generator is arranged corresponding to the signal action mechanism; The driving contact actuating mechanism is arranged in the housing of the gas density relay body, one end of the push rod close to the force transmitting part is provided with a fixing piece, and the end of the push rod far away from the force transmitting part penetrates through a fixing frame fixed on the inner wall of the housing, and extends to the lower side of the fixing frame to be relatively arranged with the signal actuating mechanism.

More preferably, the outer diameter of the first bellows is larger than the outer diameter of the second bellows.

More preferably, the signal action mechanism comprises a moving rod, one end of which extends into the second corrugated pipe, connects with the first sealing element, and generates displacement with the deformation of the first corrugated pipe; The other end of the moving rod extends out of the second corrugated pipe and is fixedly connected to an adjusting fixing piece. The adjusting fixing piece is provided with an adjusting screw, which is used to touch the signal generator under the driving force of the moving rod.

More preferably, a return spring is sleeved on the push rod between the fixing piece and the fixing frame.

More preferably, the force sensor is connected to the push rod through a contact, or the force sensor is directly connected to the push rod.

Furthermore, the force sensor is arranged at one end of the push rod facing the force transmitting member, or the force sensor is arranged at one end of the push rod facing the force transmitting member.

Preferably, the intelligent control unit acquires the gas density value collected by the first pressure sensor and temperature sensor; Alternatively, the intelligent control unit acquires the pressure value collected by the first pressure sensor and the temperature value collected by the temperature sensor to complete the online monitoring of the gas density of electrical equipment by the gas density relay.

Preferably, the intelligent control unit acquires the pressure value P1 collected by the first pressure sensor, the temperature value T collected by the temperature sensor and the force F collected by the force sensor when the contact signal of the gas density relay body acts or switches, calculates or converts the force F into the corresponding pressure value P2, and calculates the equivalent gas pressure value P according to the pressure value P1 and the pressure value P2; The online check of the gas density relay is completed according to the equivalent gas pressure value P and the pressure value corresponding to 20° C. converted according to the gas pressure temperature characteristic, i.e. the gas density value $P_{20}$; Alternatively, The intelligent control unit obtains the gas density value $P1_{20}$ collected by the first pressure sensor and the temperature sensor when the contact signal of the gas density relay body acts or switches, and the force F collected by the force measuring sensor. Combined with the temperature value T collected by the temperature sensor, the intelligent control unit calculates or converts it into the corresponding gas density value $P2_{20}$, and calculates the gas density value $P_{20}$ according to the gas density value $P1_{20}$ and the gas density value $P2_{20}$, Completing the online check of the gas density relay; Alternatively, The intelligent control unit acquires the pressure value P1 collected by the first pressure sensor, the temperature value T collected by the temperature sensor, and the force F collected by the force measuring sensor when the contact signal of the gas density relay body acts or switches, and calculates the corresponding gas density value $P_{20}$ according to the pressure values P1, T, and F to complete the online check of the gas density relay.

More preferably, when the contact signal of the gas density relay body acts or switches, its equivalent gas pressure value P=P1-P2; The online check of the gas density relay is completed according to the equivalent gas pressure value P and the pressure value corresponding to 20° C. converted according to the gas pressure temperature characteristic, i.e. the gas density value $P_{20}$; Alternatively, when the contact signal of the gas density relay body acts or switches, its equivalent gas pressure value P=P1-P2*K; Wherein, K is the preset coefficient; The online check of the gas density relay is completed according to the equivalent gas pressure value P, temperature value T, and the pressure value corresponding to 20° C. converted according to the gas pressure temperature characteristics, i.e. the gas density value $P_{20}$.

More preferably, when the contact signal of the gas density relay body acts or switches, the corresponding relationship between the gas density value $P_{20}$ and the gas density values $P1_{20}$, $P2_{20}$ is designed into a data table in advance, and the corresponding gas density value $P_{20}$ is obtained by querying the data table according to the gas density value $P1_{20}$ and the gas density value $P2_{20}$, thus completing the online check of the gas density relay; Alternatively, When the contact signal of the gas density relay body acts or switches, the corresponding relationship between the gas density value $P_{20}$ and the gas pressure values P1, P2, and the temperature value T is designed into a data table in advance, and the corresponding gas density value $P_{20}$ is obtained by querying the data table according to the gas pressure values P1, P2, and the temperature value T to complete the online check of the gas density relay; Alternatively, When the contact signal of the gas density relay body acts or switches, the corresponding relationship between the gas density value $P_{20}$ and the gas pressure value P1, the force F collected by the force measuring sensor, and the temperature value T is pre designed into a data table, and the corresponding gas density value $P_{20}$ is obtained by querying the data table according to the gas pressure values P1, F, and the temperature value T to complete the online check of the gas density relay.

Preferably, the gas density relay (or gas density monitoring device) also includes an online check contact signal sampling unit, which is respectively connected to the signal generator and intelligent control unit of the gas density relay body and configured to sample the contact signal of the gas density relay body.

More preferably, the online check contact signal sampling unit includes an isolation sampling element, which is controlled by the gas density relay body, or a driving contact action mechanism, or an intelligent control unit; In the non-check state, the online check contact signal sampling unit is relatively isolated from the contact signal of the gas density relay body on the circuit by isolating the sampling element; In the check state, the online check contact signal sampling unit cuts off the contact signal control circuit of the gas density relay body through the isolation sampling element, and connects the contact of the gas density relay body with the intelligent control unit; Wherein, the isolation sampling element includes one of the travel switch, microswitch, button, electric switch, displacement switch, electromagnetic relay, optocoupler and thyristor.

Further, the online check contact signal sampling unit includes a first connection circuit and a second connection circuit, the first connection circuit is connected to the contact of the gas density relay body and the contact signal control circuit, and the second connection circuit is connected to the contact of the gas density relay body and the intelligent control unit; In the non-check state, the second connecting circuit is disconnected and the first connecting circuit is closed; In the check state, the online check contact signal sampling unit cuts off the first connection circuit, connects the second connection circuit, and connects the contact of the gas density relay body with the intelligent control unit.

More preferably, the gas density relay (or gas density monitoring device) also includes a multichannel joint, one or more of the gas density relay body, the first pressure sensor, the driving contact action mechanism, the online check contact signal sampling unit, the intelligent control unit and the temperature sensor are arranged on the multichannel joint.

Preferably, the control of the intelligent control unit is controlled through on-site control and/or background control.

Preferably, the housing of the gas density relay body is also provided with a display mechanism for displaying the density of insulating gas.

More preferably, the display mechanism comprises a connecting mechanism, a movement, a pointer and a dial. The movement is connected to the signal actuating mechanism through the connecting mechanism. The pointer is mounted on the movement and is arranged in front of the dial. The pointer displays the gas density value in combination with the dial; Alternatively, the display mechanism includes a liquid crystal or/and a digital tube.

The second aspect of the application provides the check method for a gas density relay, including:
Under normal working condition, the gas density relay monitors the gas density value in the electrical equipment;
The gas density relay is allowed to check the gas density relay body according to the set check time or/and check command and the gas density value:
The intelligent control unit drives and drives the contact action mechanism, so that the motion mechanism driving the contact action mechanism exerts force on the elements in the gas density relay body under the drive of the force application mechanism, so that the signal action mechanism of the gas density relay body moves, and triggers the signal generator to generate contact signal action; The intelligent control unit acquires the pressure value P1 and the temperature value T collected by the first pressure sensor and the force F collected by the force sensor when the contact signal of the gas density relay body acts or switches, calculates or converts the force F into the corresponding pressure value P2, and calculates the equivalent gas pressure value P according to the pressure value P1 and the pressure value P2; The online check of the gas density relay is completed according to the equivalent gas pressure value P and the pressure value corresponding to 20° C. converted according to the gas pressure temperature characteristic, i.e. the gas density value $P_{20}$; Alternatively, The intelligent control unit obtains the gas density value $P1_{20}$ collected by the first pressure sensor and the temperature sensor when the contact signal of the gas density relay body acts or switches, and the force F collected by the force measuring sensor. Combined with the temperature value T collected by the temperature sensor, the intelligent control unit calculates or converts it into the corresponding gas density value $P2_{20}$, and calculates the gas density value $P_{20}$ according to the gas density value $P1_{20}$ and the gas density value $P2_{20}$, Completing the online check of the gas density relay; Alternatively, The intelligent control unit acquires the pressure value P1 collected by the first pressure sensor, the temperature value T collected by the temperature sensor, and the force F collected by the force measuring sensor when the contact signal of the gas density relay body acts or switches, and calculates the corresponding gas density value $P_{20}$ according to the pressure values P1, T, and F to complete the online check of the gas density relay;

When all the contact signals are checked, the intelligent control unit restores the driving contact action mechanism.

Preferably, the gas density relay also includes an online check contact signal sampling unit, which is respectively connected to the signal generator and intelligent control unit of the gas density relay body and configured to sample the contact signal of the gas density relay body; The check method includes:
Under normal working condition, the gas density relay monitors the gas density value in the electrical equipment, and the gas density relay monitors the gas density value in the electrical equipment online through the first pressure sensor, temperature sensor and intelligent control unit;
The gas density relay is allowed to check the gas density relay body according to the set check time or/and check command and the gas density value:
The online check contact signal sampling unit is adjusted to the check state through the intelligent control unit. In the check state, the online check contact signal sampling unit cuts off the control circuit of the contact signal of the gas density relay body, and connects the contact of the gas density relay body to the intelligent control unit;
The intelligent control unit drives the contact actuation mechanism, so that the motion mechanism of the contact actuation mechanism exerts force on the elements in the gas density relay body under the drive of the force application mechanism, so that the signal actuation mechanism of the gas density relay body is displaced, and the signal generator is triggered to generate contact signal actuation. The intelligent control unit acquires the pressure value P1 collected by the first pressure sensor and the temperature value T collected by the temperature sensor when the contact signal of the gas density relay body acts or switches, and the force F collected by the force sensor, calculates or converts it into the corresponding pressure value P2 according to the force F, and calculates the equivalent gas pressure value P according to the pressure value P1 and the pressure value P2; According to the equivalent gas pressure value P and the pressure value corresponding to 20° C. converted according to the gas pressure-temperature characteristic, i.e. the gas density value $P_{20}$, the online check of the gas density relay is completed; Alternatively, The intelligent control unit obtains the gas density value $P1_{20}$ collected by the first pressure sensor and the temperature sensor when the contact signal of the gas density relay body acts or switches, and the force F collected by the force measuring sensor. Combined with the temperature value T collected by the temperature sensor, the intelligent control unit calculates or converts it into the corresponding gas density value $P2_{20}$, and calculates the gas density value $P_{20}$ according to the gas density value $P1_{20}$ and the gas density value $P2_{20}$, Completing the online check of the gas density relay; Alternatively, The intelligent control unit acquires the pressure value P1 collected by the first pressure sensor, the temperature value T collected by the temperature sensor, and the force F collected by the force measuring sensor when the contact signal of the gas density relay body acts or switches, and calculates the corresponding gas density value $P_{20}$ according to the pressure values P1, T, and F to complete the online check of the gas density relay;

When all the contact signal check work is completed, the intelligent control unit restores the driving contact action mechanism, adjusts the online check contact signal sampling unit to the working state, and the control circuit of the contact signal of the gas density relay body returns to the normal working state.

Preferably, the check method for a gas density relay includes:

When the contact signal of the gas density relay body acts or switches, its equivalent gas pressure value P=P1−P2; The online check of the gas density relay is completed according to the equivalent gas pressure value P and the pressure value corresponding to 20° C. converted according to the gas pressure temperature characteristic, i.e. the gas density value $P_{20}$; Alternatively, When the contact signal of the gas density relay body acts or switches, its equivalent gas pressure value P=P1−P2*K; Wherein, K is the preset coefficient; The online check of the gas density relay is completed according to the equivalent gas pressure value P, temperature value T, and the pressure value corresponding to 20° C. converted according to the gas pressure temperature characteristics, i.e. the gas density value $P_{20}$; Alternatively, When the contact signal of the gas density relay body acts or switches, the corresponding relationship between the gas density value $P_{20}$ and the gas density values $P1_{20}$, $P2_{20}$ is pre designed into a data table, and the corresponding gas density value $P_{20}$ is obtained by querying the data table according to the gas density value $P1_{20}$ and the gas density value $P2_{20}$, thus completing the online check of the gas density relay; Alternatively, When the contact signal of the gas density relay body acts or switches, the corresponding relationship between the gas density value $P_{20}$ and the gas pressure values P1, P2, and the temperature value T is designed into a data table in advance, and the corresponding gas density value $P_{20}$ is obtained by querying the data table according to the gas pressure values P1, P2, and the temperature value T to complete the online check of the gas density relay; Alternatively, When the contact signal of the gas density relay body acts or switches, the corresponding relationship between the gas density value $P_{20}$ and the gas pressure value P1, the force F and the temperature value T collected by the force measuring sensor is pre designed into a data table, and the corresponding gas density value $P_{20}$ is obtained by querying the data table according to the gas pressure value P1, the force F and the temperature value T collected by the force measuring sensor, The online check of the gas density relay is completed.

Compared with the prior art, the technical solution of the invention has the following beneficial effects:

The application provides a gas density relay with online self-check function and its check method for high-voltage and medium-voltage electrical equipment, including a gas density relay body, a first pressure sensor, a temperature sensor, a force measuring sensor, a driving contact action mechanism and an intelligent control unit. The driving contact action mechanism is configured to directly or indirectly drive the signal action mechanism of the gas density relay body to displacement, so that the gas density relay body will have contact signal action. The intelligent control unit will detect the alarm and/or blocking contact signal action value and/or return value of the gas density relay body according to the density value when the contact acts. Checking the gas density relay can be completed without maintainer coming to the site, which improves the reliability of the power grid, improves the efficiency, reduces the cost, and implements maintenance free of gas density relay. At the same time, the whole check process achieved zero discharge of SF6 gas, meeting the requirements of environmental protection regulations. Most importantly, due to the technical innovation of the invention, the driving contact actuating mechanism is not connected to the SF6 main gas path of the gas density relay body or electrical equipment, which can greatly improve the reliability of the power grid, reduce its sealing requirements, reduce the manufacturing cost, and improve the convenience and flexibility of on-site installation. The application implements online check of gas density relay, thus implementing intelligent management of the whole life cycle of gas density relay: only repair if there is a problem, and no operation and maintenance service if there is no problem.

BRIEF DESCRIPTION OF DRAWINGS

The drawings constituting a part of the application are used to provide a further understanding of the application. The schematic embodiments and their descriptions of the application are used to explain the application, and do not constitute an improper limitation of the application. In the drawings.

DETAILED DESCRIPTION

In order to make the purpose, technical solution and effect of the invention more clear and definite, the invention is further described in detail below with reference to the drawings and examples. It should be understood that specific embodiments are only used to explain the invention, not to define the invention.

Embodiment 1

Figure 1:
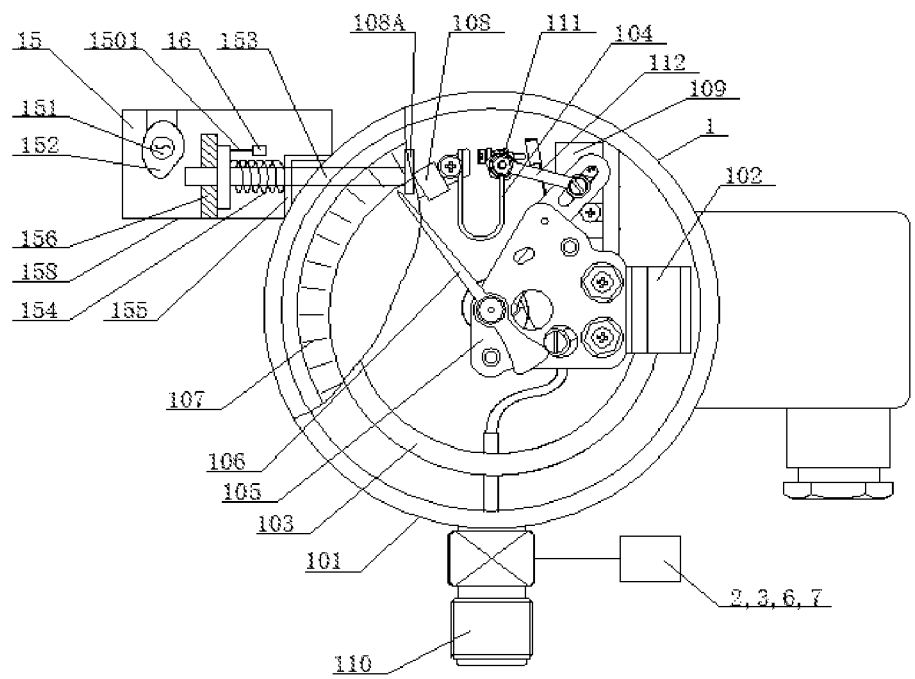
FIG. 1 is the structural diagram of the gas density relay with online self-check function in Embodiment 1.

FIG. 1 is the structural diagram of the gas density relay (or gas density monitoring device) in Embodiment 1 of the Application. As shown in FIG. 1, a gas density relay includes a gas density relay body 1, a first pressure sensor 2, a temperature sensor 3, a force sensor 16, a driving contact actuating mechanism 15, an online check contact signal sampling unit 6 and an intelligent control unit 7.

The gas density relay body 1 includes a housing 101, a base 102, an end seat 108, a pressure detection element 103, a temperature compensation element 104, a number of signal generators 109, a movement 105, a pointer 106, a connecting rod 112, and a dial 107 arranged in the housing 101. The movement 105 is fixed on the base 102; One end of the pressure detection element 103 (bourdon tube) is fixed on the base 102 and connected to it. The pressure detection element 103 (bourdon tube) is filled with sealing gas. The other end of the pressure detection element 103 (bourdon tube) is connected to one end of the temperature compensation element 104 through the end seat 108. The temperature compensation element 104 uses a temperature compensation sheet, The other end of the temperature compensation element 104 is provided with a signal operating mechanism 111; The signal action mechanism 111 is provided with a regulating element (such as a regulating screw) that pushes the signal generator 109 to connect or disconnect the contact of the signal generator 109. The signal generator 109 includes a microswitch or a magnetic assisted electrical contact. The gas density relay body 1 outputs a contact signal through the signal generator 109. The end seat 108 is provided with an end seat contact plate 108A. The other end of the temperature compensation element 104 is also connected to the movement 105 through the connecting rod 112 or directly connected to the movement 105; The pointer 106 is mounted on the movement 105 and placed in front of the dial 107. The pointer 106 displays the gas density value in combination with the dial 107. The gas density relay body 1 can also include a digital device or a liquid crystal device with a value display.

The gas density relay body 1 in this embodiment can be an oil filled density relay, an oil free density relay, a gas density meter, a gas density switch or a gas pressure gauge. The first pressure sensor 2, temperature sensor 3, online check contact signal sampling unit 6 and intelligent control unit 7 are arranged on the joint 110. The force measuring sensor 16 and the driving contact actuating mechanism 15 are arranged outside the housing 101. The first pressure sensor 2, temperature sensor 3, online check contact signal sampling unit 6, force measuring sensor 16 and intelligent control unit 7 are connected; The online check contact signal sampling unit 6 is connected to the signal generator 109.

The driving contact actuating mechanism 15 is arranged outside the housing 101, corresponding to the end seat contact plate 108A on the end seat 108 of the gas density relay body 1; The driving contact actuating mechanism 15 is configured to indirectly shift the signal actuating mechanism 111 of the gas density relay body 1, thereby enabling the gas density relay body 1 to perform contact signal action. Specifically, the contact actuating mechanism 15 includes a housing 158 with an opening, a driving component 151, a force transmitting member 152, and a push rod 153 arranged in the housing 158. The push rod 153 corresponds to the end seat contact plate 108A, and the opening of the housing 158 faces the housing 101 of the gas density relay body 1. The force transmitting member 152 rotates under the drive of the driving member 151; One end of the push rod 153 close to the force transmitting member 152 is provided with a fixing member 156, which is fixedly arranged on the inner wall of the outer cover 158. One end of the push rod 153 far from the force transmitting member 152 passes through the fixing frame 155 fixed at the opening of the outer cover 158. The fixing frame 155 is provided with a through guide hole for the push rod 153 to pass through. The inner diameter of the guide hole is larger than the outer diameter of the push rod 153. The end of the push rod 153 far from the force transmitting member 152 passes through the guide hole on the fixing frame 155, The air hole on the housing 101 of the gas density relay body 1 extends into the housing 101, and the push rod 153 extends into the end of the housing 101 and is opposite to the end seat contact plate 108A in the housing 101.

In this embodiment, the driving part 151 is a motor, the power transmission part 152 is a cam, and the cam rotates under the drive of the motor. There are many specific ways for the motor to drive the cam to rotate. For example, two support plates are connected to a rotating shaft through bearings. The cam is set between the two support plates through the rotating shaft. The output shaft of the motor is fixedly connected to one end of the rotating shaft. When the motor rotates, it drives the rotating shaft to rotate, thus driving the cam fixed on the rotating shaft to rotate. For another example, a rotatable rotating shaft is erected above the push rod, the cam and a big gear are fixed on the rotating shaft in a coaxial manner, and a small gear is fixed on the output shaft of the motor. The small gear is meshed with the big gear. When the motor rotates, the small gear is driven to rotate, and the big gear rotates with it, driving the rotating shaft for installing the big gear to rotate, thus driving the cam fixed on the rotating shaft to rotate.

The push rod 153 between the fixing part 156 and the fixing frame 155 is sleeved with a return spring 154. One end of the return spring 154 is fixedly connected to the fixing part 156, and the other end is fixedly connected to the fixing frame 155. When the push rod 153 is under no force, the end face on the cam opposite to the convex part of the cam contacts one end of the push rod 153 provided with the fixing part 156. The return spring 154 is in a natural extension state. The part of the push rod 153 extending out of the fixing frame 155 is located at one side of the end seat contact plate 108A of the gas density relay body 1 and does not contact the end seat contact plate 108A. When the motor drives the cam to rotate, the convex part of the cam hits the push rod 153, which drives the push rod 153 to move along its axial direction. When the convex part of the cam leaves one end of the push rod 153 with a fixing element 156, the push rod 153 resets under the elastic force of the return spring 154.

The driving contact action mechanism 15 also includes a force sensor 16, which is connected to the push rod 153 through the contact 1501. In this embodiment, the force measuring sensor 16 is a displacement sensor or a shape variable sensor, which is arranged at one end of the push rod 153 with a fixing element 156. The force measuring sensor 16 is connected to the intelligent control unit 7 to detect the force F exerted by the driving contact action mechanism 15 on the end seat 108.

When the driving part 151 does not apply force, under the action of the spring 154, the push rod 153 is far away from the end seat contact plate 108A, and the push rod 153 does not apply force to the end seat contact plate 108A. The force measuring sensor 16 is connected to the push rod 153 through the contact 1501. The push rod 153 is affected by the force applying component 151 and the force transmitting component 152. Its force F on the spring 154 can be obtained through the force measuring sensor 16 to detect the shape of the spring 154 (F=L*N, wherein, L is the shape variable, mm; N is the elastic coefficient, kg/mm). During check, the force application part 151 rotates the force transmission part 152, and then pushes the push rod 153 to move to the right, thereby exerting force F on the spring 154 and the end seat contact plate 108A (i.e., the end seat 108), that is, the force application part 151 exerts force on the end seat 108 through the force transmission part 152, so that the contact signal of the gas tightness relay body 1 can be activated.

The above drive components 151 include, but are not limited to, magnetic drive mechanism, gravity, motor (such as electric push rod motor, stepping motor), reciprocating mechanism, Carnot circulation mechanism, air compressor, compressor, vent valve, pressure pump, booster pump, booster valve, electric air pump, electromagnetic air pump, pneumatic components, magnetic coupling thrust mechanism, heating thrust mechanism, electric heating thrust mechanism One of the thrust mechanisms generated by chemical reaction; The force transmitting member 152 includes, but is not limited to, a cam, a connecting rod, a spring, a metal piece, a non-metallic piece, an expansion piece, and a non-expansion piece; The force measuring sensor 16 includes, but is not limited to, a gravity sensor, a pressure sensor, a magnetic sensor, a displacement sensor, a shape variable sensor, a photoelectric sensor, an angle sensor, a deformation piece sensor, a force sensor, and a camera, while the displacement sensor includes, but is not limited to, a laser displacement sensor, an infrared displacement sensor, a contact displacement sensor, and a non-contact displacement sensor.

Its working principle is as follows:

The intelligent control unit 7 monitors the gas pressure and temperature of the electrical equipment according to the first pressure sensor 2 and temperature sensor 3, and obtains the corresponding 20° C. pressure value $P_{20}$ (i.e. the gas density value). When it is necessary to check the gas density relay body 1, if the gas density value $P_{20} \geq$ the set safety check density value $P_S$; The intelligent control unit 7 disconnects the control circuit of the gas density relay body 1, so that the online check of the gas density relay body 1 will not affect the safe operation of electrical equipment, nor will it send false alarm signals or lock the control circuit during the check. Because the gas density relay has been monitored and judged that the gas density value $P_{20} \geq$ the set safety check density value $P_S$ before the check, the gas of the electrical equipment is within the safe operation range, and the gas leakage is a slow process, so the check is safe. Meanwhile, the intelligent control unit 7 is connected to the contact sampling circuit of the gas density relay body 1.

The contact actuating mechanism 15 is driven and driven by the intelligent control unit 7 to displace the end seat 108 of the gas density relay body 1, and the signal actuating mechanism 111 is displaced by the temperature compensation element 104. The adjusting element (for example, the adjusting screw) on the signal actuating mechanism 111 pushes the signal generator 109 (for example, the microswitch), and the contact of the signal generator 109 is connected to send out the corresponding contact signal (alarm or blocking).

Then, the push rod 153 resets under the elastic force of the return spring 154, no longer exerting force on the end seat contact plate 108A, the temperature compensation element 104 resets, the adjusting element is far away from the signal generator 109, the contact of the signal generator 109 is disconnected, and the contact signal (alarm or blocking) is released.

The intelligent control unit 7 acquires the pressure value P1 collected by the first pressure sensor 2, the temperature value T collected by the temperature sensor 3 and the force F collected by the force sensor 16 when the contact signal of the gas density relay body 1 acts or switches, calculates or converts the force F into the corresponding pressure value P2, and calculates the equivalent gas pressure value P according to the pressure value P1 and the pressure value P2; The online check of the gas density relay is completed according to the equivalent gas pressure value P and the pressure value corresponding to 20° C. converted according to the gas pressure temperature characteristics, i.e. the gas density value $P_{20}$. Alternatively, the intelligent control unit 7 acquires the gas density value $P1_{20}$ collected by the first pressure sensor 2 and temperature sensor 3 when the contact signal of the gas density relay body 1 acts or switches, and the force F collected by the force measuring sensor 16. Combined with the temperature value T collected by the temperature sensor 3, the force F is calculated or converted into the corresponding gas density value $P2_{20}$, the gas density value $P_{20}$ is calculated according to the gas density value $P1_{20}$ and $P2_{20}$, and the online check of the gas density relay is completed. Further, when the contact signal of gas density relay body 1 acts or switches, its equivalent gas pressure value P=P1-P2; The online check of the gas density relay is completed according to the equivalent gas pressure value P and the pressure value corresponding to 20° C. converted according to the gas pressure temperature characteristic, i.e. the gas density value $P_{20}$; Alternatively, when the contact signal of gas density relay body 1 acts or switches, its equivalent gas pressure value P=P1-P2*K; Wherein, K is the preset coefficient, which is obtained according to the characteristics of the gas density relay body; The online check of the gas density relay is completed according to the equivalent gas pressure value P, temperature value T, and the pressure value corresponding to 20° C. converted according to the gas pressure temperature characteristics, i.e. the gas density value $P_{20}$. Alternatively, when the contact signal of the gas density relay body 1 acts or switches, the corresponding relationship between the gas density value $P_{20}$ and the gas density values $P1_{20}$, $P2_{20}$ can be designed into a data table, and the corresponding gas density value $P_{20}$ can be obtained by querying the data table according to the gas density value $P1_{20}$ and the gas density value $P2_{20}$, thus completing the online check of the gas density relay; Alternatively, when the contact signal of the gas density relay body 1 acts or switches, the corresponding relationship between the gas density value $P_{20}$ and the gas pressure values P1, P2, and the temperature value T is designed into a data table, and the corresponding gas density value $P_{20}$ is obtained by querying the data table according to the gas pressure values P1, P2, and the temperature value T to complete the online check of the gas density relay. Repeat the check for many times (for example, 2-3 times), and then calculate the average value, thus completing checking gas density relay body 1. Then, the intelligent control unit 7 disconnects the contact sampling circuit of the gas density relay body 1. At this time, the contact of the gas density relay body 1 is not connected to the intelligent control unit 7. At the same time, the contact actuating mechanism 15 is recovered and driven by the intelligent control unit 7. The control circuit of the gas density relay body 1 is connected through the intelligent control unit 7, the density monitoring circuit of the gas density relay body 1 works normally, and the gas density of the electrical equipment is monitored safely by the gas density relay body 1, so that the electrical equipment can work safely and reliably. In this way, it is convenient to complete the online check of gas density relay body 1, and the safe operation of electrical equipment will not be affected when the gas density relay body 1 is checked online.

When the gas density relay body 1 has completed the check, the gas density relay will make a decision, and the notice about detection result can be released. The mode is flexible, specifically: 1) local notice, such as display through indicator light, digital or LCD; 2) Or upload via online remote communication, for example, upload to the background of online monitoring system; 3) Or upload to specific terminals through wireless upload, for example, wireless upload to mobile phones; 4) Or upload through other channels; 5) Or upload the abnormal results through the alarm signal line or special signal line; 6) Uploading alone or bundled with other signals. In a word, after completing the online check of the gas density relay, if there is any abnormality, it can automatically send an alarm, which can be uploaded to the remote end or sent to a designated receiver, such as a mobile phone. Alternatively, after completing checking the gas density relay, if there is any abnormality, the intelligent control unit 7 can upload the alarm contact signal of the gas density relay body 1 to the remote end (monitoring room, background monitoring platform, etc.), and can also display the notice locally. The simple online check of gas density relay can upload the abnormal results through the alarm signal line. It can be uploaded according to certain rules. For example, in case of abnormality, a contact is connected in parallel at the alarm signal contact, which is closed and disconnected regularly, and the condition can be obtained through analysis; Or upload through an independent check signal line. It can be uploaded in good condition or in case of problems. It can also be uploaded through remote density online monitoring, or the check results can be uploaded through a separate check signal line, or through local display, local alarm, or through wireless upload, online upload with intelligent phones. Its communication mode is wired or wireless. The wired communication mode can be RS232, RS485, CAN-BUS and other industrial buses, optical Ethernet, 4-20 mA, Hart, IIC, SPI, wire, coaxial cable, PLC power carrier, etc.; Wireless communication mode can be 2G/3G/4G/5G, WIFI, Bluetooth, Lora, Lorawan, Zigbee, infrared, ultrasonic, acoustic, satellite, optical, quantum communication, sonar, sensor built-in 5G/NB-IOT communication module (such as NB-IOT), etc. In a word, the reliable performance of gas density relay can be fully guaranteed by multiple ways and combinations.

The gas density relay can be checked online according to the set time or the set temperature (such as extreme high temperature, high temperature, extreme low temperature, low temperature, normal temperature, 20° C., etc.). During online check of high temperature, low temperature, normal temperature and 20° C. ambient temperature, the error judgment requirements are different. For example, during check of 20° C. ambient temperature, the accuracy requirements of the gas density relay can be level 1.0 or 1.6, and it can be level 2.5 at high temperature. The details can be implemented according to the requirements of temperature and relevant standards. For example, according to 4.8 temperature compensation performance provisions in DL/T 259 check Code for Sulfur Hexafluoride Gas Density Relays, the accuracy requirements corresponding to each temperature value.

The gas density relay can compare its error performance in different temperature and time periods. That is, the performance of gas density relay and electrical equipment can be judged by comparison in different periods and within the same temperature range. There is a comparison between different periods of history and between history and the present.

The gas density relay can be checked for many times (e.g. 2-3 times), and the average value is calculated according to the results of each check. If necessary, the gas density relay can be checked online at any time.

The gas density relay has the functions of pressure and temperature measurement and software conversion. On the premise of not affecting the safe operation of electrical equipment, the alarm and/or blocking contact action value and/or return value of gas density relay body 1 can be detected online. Of course, the return value of alarm and/or blocking contact signal can also be not tested as required. At the same time, the gas density relay can also monitor the gas density value, and/or pressure value, and/or temperature value of electrical equipment online, and upload them to the target equipment for online monitoring.

The gas density relay body 1 can be a bimetallic sheet compensated gas density relay, a gas compensated gas density relay, or a bimetallic sheet and gas compensated hybrid gas density relay; Fully mechanical gas density relay, digital gas density relay, mechanical and digital combined gas density relay; Density relay with indication (density relay with pointer display, density relay with digital display, density relay with LCD display), density relay without indication (density switch); SF6 gas density relay, SF6 mixed gas density relay, N2 gas density relay, other gas density relays, etc.

The type of the first pressure sensor 2 can be absolute pressure sensor, relative pressure sensor, or absolute pressure sensor and relative pressure sensor, and the number can be several. The pressure sensor can be in the form of diffused silicon pressure sensor, MEMS pressure sensor, chip type pressure sensor, coil induced pressure sensor (such as the pressure measurement sensor with induction coil attached to the bourdon tube), and resistance pressure sensor (such as the pressure measurement sensor with sliding wire resistance attached to the bourdon tube); It can be an analog pressure sensor or a digital pressure sensor. Pressure acquisition includes pressure sensors, pressure transmitters and other pressure sensing elements, such as diffused silicon type, sapphire type, piezoelectric type, and strain gauge type (resistance strain gauge type, ceramic strain gauge type).

The temperature sensor 3 can be a thermocouple, a thermistor or a semiconductor type; It can be contact type or non-contact type; It can be thermal resistance and thermocouple. In a word, temperature sensors, temperature transmitters and other temperature sensing elements can be used for temperature acquisition.

The online check contact signal sampling unit 6 is used to complete the contact signal sampling of the gas density relay body 1. That is, the basic requirements or functions of online check contact signal sampling unit 6 are as follows: 1) The safe operation of electrical equipment will not be affected during check. That is, when the contact signal of gas density relay body 1 acts during check, the safe operation of electrical equipment will not be affected; 2) The contact signal control circuit of the gas density relay body 1 will not affect the performance of the gas density relay, especially the performance of the intelligent control unit 7, and will not damage the gas density relay or affect the test work.

The basic requirement or function of the above intelligent control unit 7 is to be able to detect the pressure value and temperature value when the contact signal of the gas density relay body 1 acts, and convert them into the corresponding pressure value $P_{20}$ (density value) at 20° C., that is, to be able to detect the contact action value PD20 of the gas density relay body 1, and complete checking the gas density relay body 1. Alternatively, it can directly detect the density value PD20 when the contact signal of gas density relay body 1 acts, and complete checking gas density relay body 1. Of course, the intelligent control unit 7 can also implement: test data storage; and/or test data export; and/or test data can be printed; and/or data communication can be conducted with the upper computer; and/or analog quantity and digital quantity information can be entered. The intelligent control unit 7 also includes a communication module, through which test data and/or check results can be transmitted remotely; When the rated pressure value of the gas density relay body 1 outputs a signal, the intelligent control unit 7 simultaneously collects the current density value to complete checking the rated pressure value of the gas density relay body 1. At the same time, the self-check among the gas density relay body 1, pressure sensor 2 and temperature sensor 3 can be completed by testing the rated pressure value of the gas density relay body 1 to achieve maintenance free.

The above electrical equipment includes SF6 gas electrical equipment, SF6 mixed gas electrical equipment, environment-friendly gas electrical equipment, or other insulated gas electrical equipment. Specifically, electrical equipment includes GIS, GIL, PASS, circuit breaker, current transformer, voltage transformer, transformer, gas filled cabinet and ring main unit.

The gas density relay body 1, the first pressure sensor 2, the temperature sensor 3, the actuating contact mechanism 15, the online check contact signal sampling unit 6 and the intelligent control unit 7 can be flexibly set as required. For example, the gas density relay body 1, the pressure sensor 2 and the temperature sensor 3 are arranged together; In short, the settings between them can be flexibly arranged and combined.

The force application mechanism and the motion mechanism can also be designed in an integrated way; Alternatively, the driving component of the force application mechanism and the force transmitting component driven by the driving component can also be designed integrally; The push rod of the motion mechanism generally refers to the push piece. The push rod (push piece) moves under the drive of the force application mechanism, which directly or indirectly displaces the signal action mechanism. The force transmission parts generally refer to the force transmission parts, including but not limited to one of cam, connecting rod, spring, metal parts, non-metallic parts, expansion parts and non-expansion parts. The driving contact action mechanism can be arranged in the housing of the gas density relay body. The push rod penetrates the end of the fixed frame and extends into the housing from the air hole on the housing of the gas density relay body. The push rod can be in sealed contact with the inner wall of the housing or not; The push rod is relatively arranged with the pressure detection element, or the temperature compensation element, or the signal generator, or the signal actuating mechanism, or the push rod is directly or indirectly connected or contacted with the pressure detection element, or the temperature compensation element, or the signal generator, or the signal actuating mechanism. The force measuring sensor can also be directly connected to the pressure detection element, the temperature compensation element, the signal generator, or the signal action mechanism through the contact or through the contact. The signal action mechanism is provided with a trigger to push the signal generator and make the contact of the signal generator connect or disconnect. Specifically, the trigger completes the contact connection or disconnection of the signal generator (specifically, the magnetic assisted electrical contact) according to the gas density value, and the gas density relay body outputs the contact signal through the signal generator (specifically, the magnetic assisted electrical contact).

Embodiment 2

Figure 2:
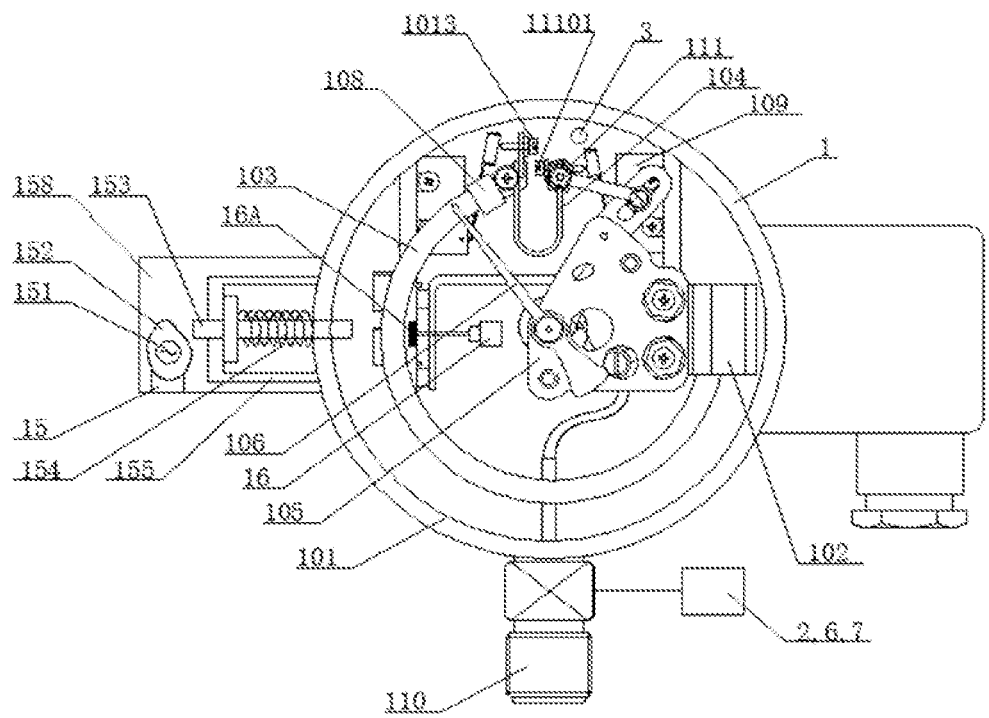
FIG. 2 is the structural diagram of the gas density relay with online self-check function in Embodiment 2.

As shown in FIG. 2, Embodiment 2 of the invention provides a gas density relay (or gas density monitoring device) with online self-check function. The difference from Embodiment 1 is that:

1) The driving contact actuating mechanism 15 is arranged outside the housing 101 and is relatively arranged with the pressure detecting element 103 (bourdon tube) of the gas density relay body 1; The driving contact actuating mechanism 15 is configured to indirectly make the signal actuating mechanism 111 of the gas density relay body 1 produce corresponding displacement, thereby making the gas density relay body 1 produce contact signal action.

The driving contact actuating mechanism 15 comprises a housing 158 with an opening at one end, a driving component 151, a power transmission member 152 (cam), a push rod 153, a spring 154, and a fixing frame 155 arranged in the housing 158; Wherein, the opening of the housing 158 faces the housing 101 of the gas density relay body 1, and the push rod 153 is relatively arranged with the pressure detection element 103 (bourdon tube) in the housing 101. The force measuring sensor 16 (in this case, a pressure sensor, or a displacement sensor, or a deformation sensor, or a photoelectric sensor, or a deformation piece sensor) is relatively set with the pressure detecting element 103 (bourdon tube). The force contact 16A of the force measuring sensor 16 contacts the pressure detecting element 103 (bourdon tube). The force F exerted by the push rod 153 on the pressure detecting element 103 (bourdon tube) can be detected through the force measuring sensor 16.

The force transmitting member 152 rotates under the drive of the driving member 151; The fixing frame 155 is fixedly arranged on the housing 101 of the gas density relay body 1; One end of the push rod 153 close to the power transmission member 152 penetrates through the fixed frame 155. After the end of the push rod 153 far away from the power transmission member 152 extends from the opening of the housing 158, the push rod 153 extends into the housing 101 through the air hole on the housing 101 of the gas density relay body 1 and is sealed with the inner wall of the housing 101. The end of the push rod 153 extended into the housing 101 is opposite to the end of the pressure detection element 103 (bourdon tube) in the housing 101. The push rod 153 between the fixing frame 155 and the air hole of the housing 101 is sleeved with a return spring 154. One end of the return spring 154 is fixedly connected to the fixing frame 155, and the other end is fixedly connected to the housing 101. When the push rod 153 is under no force, the end face of the force transmitting part 152 (cam) opposite to the convex part of the force transmitting part 152 (cam) contacts with one end of the push rod 153 passing through the fixed frame 155. The return spring 154 is in a natural extension state. The part of the push rod 153 extending into the housing 101 is located at one side of the pressure detecting element 103 (bourdon tube) of the gas tightness relay body 1 and is not in contact with the pressure detecting element 103 (bourdon tube), That is, the push rod 153 does not exert force on the pressure detecting element 103 (bourdon tube).

During check, the driving part 151 (motor) drives the force transmitting part 152 (cam) to rotate, the convex part of the force transmitting part 152 (cam) hits the push rod 153, which drives the push rod 153 to move along its axial direction. The push rod 153 applies force F to the pressure detecting element 103 (bourdon tube), forcing the end seat 108 at the end of the pressure detecting element 103 (bourdon tube) to displace, and the signal actuating mechanism 111 to displace with the help of the temperature compensation element 104, The adjusting element (for example, the adjusting screw) on the signal actuating mechanism 111 pushes the signal generator 109 (for example, the microswitch), and the contact of the signal generator 109 is connected to send out the corresponding contact signal (alarm or blocking). Then, when the convex part of the force transmitting element 152 (cam) leaves the push rod 153 and passes through one end of the fixed frame 155, the push rod 153 resets under the elastic force of the return spring 154, and no longer exerts force on the pressure detecting element 103 (bourdon tube). The temperature compensation element 104 resets, the adjusting element is far away from the signal generator 109, the contact of the signal generator 109 is disconnected, and the contact signal (alarm or blocking) is released.

The intelligent control unit 7 acquires the pressure value P1 collected by the first pressure sensor 2 and the temperature value T collected by the temperature sensor 3 when the contact signal of the gas density relay body 1 acts or switches, and the force F collected by the force measuring sensor 16 is calculated or converted into the corresponding pressure value P2 according to the force F, and the equivalent gas pressure value P is calculated according to the pressure value P1 and the pressure value P2; The online check of the gas density relay is completed according to the equivalent gas pressure value P and the pressure value corresponding to 20° C. converted according to the gas pressure temperature characteristics, i.e. the gas density value $P_{20}$.

2) In this embodiment, the first pressure sensor 2, the online check contact signal sampling unit 6 and the intelligent control unit 7 are set on the joint 110. The temperature sensor 3 is arranged in the housing 101 and close to the temperature compensation element 104, or the temperature sensor 3 is directly arranged on the temperature compensation element 104. The first pressure sensor 2, temperature sensor 3, online check contact signal sampling unit 6 and force measuring sensor 16 are respectively connected to the intelligent control unit 7; The online check contact signal sampling unit 6 is also connected to the signal generator 109.

Embodiment 3

Figure 3:
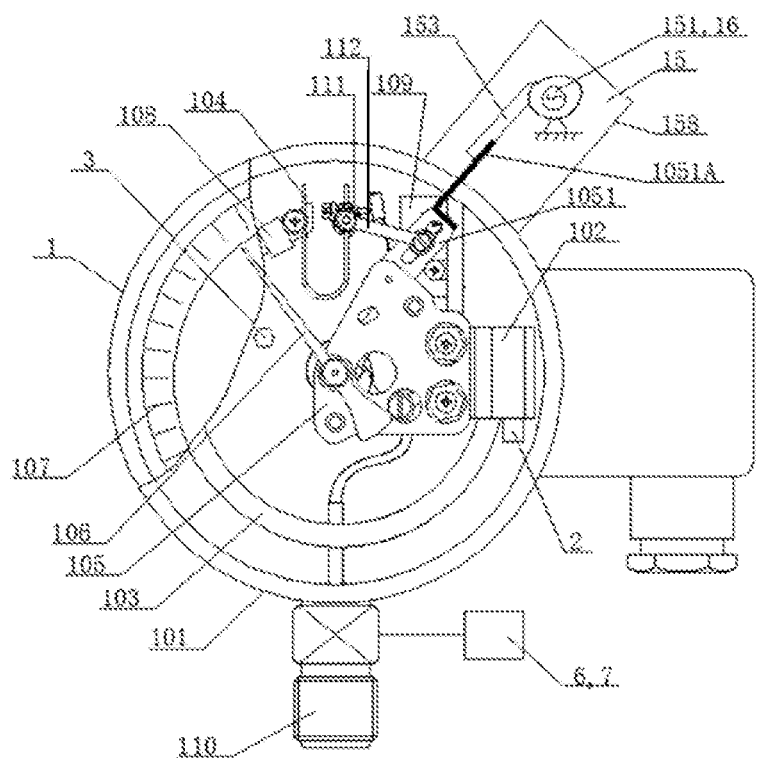
FIG. 3 is the structural diagram of the gas density relay with online self-check function in Embodiment 3.

As shown in FIG. 3, Embodiment 3 of the invention provides a gas density relay (or gas density monitoring device) with online self-check function. The difference from Embodiment 1 is that:

1) The driving contact actuating mechanism 15 is arranged outside the housing 101, including a housing 158 with an opening at one end, a driving component 151, a force transmitting member 152 (cam) and a push rod 153 arranged inside the housing 158; The cover 158 is sealed (mainly waterproof intrusion) and connected to the housing 101 of the gas density relay body 1, and the opening of the cover 158 faces the housing 101. The driving contact actuating mechanism 15 is configured to indirectly shift the signal actuating mechanism 111 of the gas density relay body 1, thereby enabling the gas density relay body 1 to perform contact signal action.

The movement 105 of the gas density relay body 1 includes a sector gear 1051 and a central gear. The first end of the sector gear 1051 is engaged with the central gear, and the second end of the sector gear 1051 is directly connected to the other end of the temperature compensation element 104 through the connecting rod 112 or through the connecting rod; The second end of the sector gear 1051 is fixedly connected to one end of the sector gear contact 1051A. The other end of the sector gear contact 1051A extends out of the housing 101 from the air hole of the housing 101 of the gas density relay body 1, and is opposite to the end of the push rod 153 driving the contact action mechanism 15 away from the force application mechanism. The driving part 151 and the force transmitting part 152 exert force on the sector gear contact 1051A through the push rod 153, the second end of the sector gear 1051 generates displacement, the first end of the sector gear 1051 meshing with the central gear drives the central gear to rotate, the central gear and the pointer 106 are installed on the driving rod, the rotation of the central gear drives the driving rod to rotate, so that the pointer 106 moves and indicates on a certain scale of the dial 107.

The force measuring sensor 16 (in this case, it is a pressure sensor, or a displacement sensor, or a deformation sensor, or a photoelectric sensor, or a deformation sheet sensor) is arranged on the actuating contact mechanism 15, and can detect the force F exerted by the push rod 153 on the sector gear contact 1051A.

Its working principle is: when the driving part 151 does not apply force, the push rod 153 is far away from the sector gear contact 1051A, and the push rod 153 does not apply force to the sector gear contact 1051A. During check, said driving component 151 applies force F to sector gear contact 1051A through push rod 153, causing corresponding displacement of sector gear 1051. With the help of connecting rod 112 and temperature compensation element 104, it drives signal action mechanism 111 to generate displacement, so that the adjusting element (such as adjusting screw) on signal action mechanism 111 drives signal generator 109, making the contact of signal generator 109 connected or disconnected, Drive the gas density relay body 1 to generate contact signal action. At the same time, the intelligent control unit 7 acquires the pressure value P1 collected by the first pressure sensor 2 and the temperature value T collected by the temperature sensor 3 when the contact signal of the gas density relay body 1 acts or switches, and the force F collected by the force measuring sensor 16 is calculated or converted into the corresponding pressure value P2 according to the force F, and the equivalent gas pressure value P is calculated according to the pressure value P1 and the pressure value P2; The online check of the gas density relay is completed by converting the pressure value P of equivalent gas and the pressure value $P_{20}$ corresponding to 20° C. according to the gas pressure temperature characteristics, i.e. the gas density value $P_{20}$.

2) In this embodiment, the online check contact signal sampling unit 6 and the intelligent control unit 7 are set on the joint 110. The first pressure sensor 2 is arranged on the base 102, and the temperature sensor 3 is arranged inside the housing 101. The first pressure sensor 2, temperature sensor 3, online check contact signal sampling unit 6 and force measuring sensor 16 are respectively connected to the intelligent control unit 7.

Embodiment 4

Figure 4:
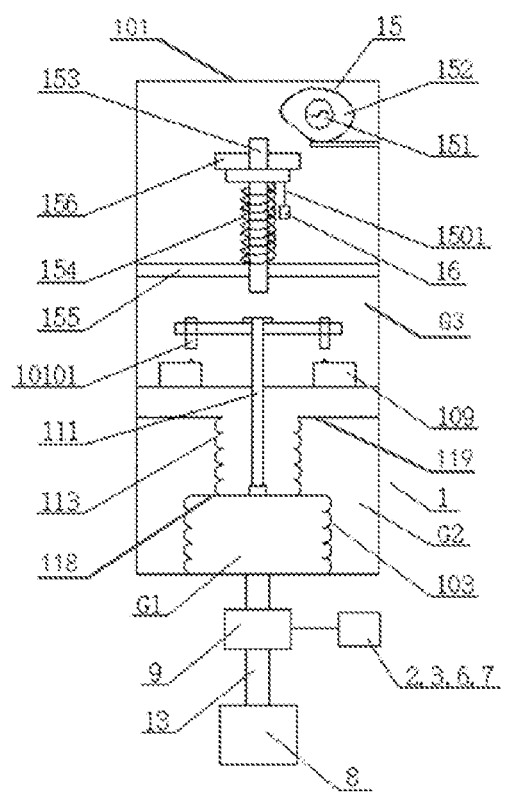
FIG. 4 is the structural diagram of the gas density relay with online self-check function in Embodiment 4.

As shown in FIG. 4, Embodiment 4 of the invention provides a gas density relay (or gas density monitoring device) with online self-check function. As shown in FIG. 4, a gas density relay includes gas density relay body 1, first pressure sensor 2, temperature sensor 3, force sensor 16, driving contact action mechanism 15, online check contact signal sampling unit 6 and intelligent control unit 7.

The difference from Embodiment 1 is that:

1) The gas density relay body 1 of the embodiment adopts a corrugated pipe type gas density relay. Specifically, it includes a housing 101, a first bellows 103 (i.e., a pressure detection element), a second bellows 113, a signal generator 109 (microswitch in this embodiment), and a signal actuating mechanism 111. Wherein, the first open end of the first corrugated pipe 103 is fixed on the inner wall of the housing 101, the second open end of the first corrugated pipe 103 is hermetically connected to the first sealing element 118, the inner wall of the first corrugated pipe 103, the first sealing element 118 and the inner wall of the housing 101 form the first sealing gas chamber G1, and the first pressure sensor 2 is connected to the first sealing gas chamber G1. The first sealing gas chamber G1 is connected to the insulating gas of the electrical equipment 8 through the multichannel joint 9 and the electrical equipment joint 13. The first open end of the second corrugated pipe 113 is hermetically connected to the first sealing element 118, the second open end of the second corrugated pipe 113 is connected to the inner wall of the housing 101 through the second sealing element 119, and the outer wall of the first corrugated pipe 103, the first sealing element 118, the outer wall of the second corrugated pipe 113, the second sealing element 119 and the inner wall of the housing 101 form a second sealing chamber G2, The second sealing gas chamber G2 is filled with a standard compensation gas with a density value of P20BC, that is, the second sealing gas chamber G2 is a temperature compensation standard gas chamber, forming a temperature compensation element. The inner wall of the second corrugated pipe 113, the second sealing element 119 and the inner wall of the housing 101 form a third gas chamber G3, which can be relatively sealed or semi open. The signal actuating mechanism 111 and the signal generator 109 are arranged in the third gas chamber G3. The signal actuating mechanism 111 is connected to the first sealing element 118, the signal generator 109 is set corresponding to the signal actuating mechanism 111, and the gas density relay body 1 outputs contact signals through the signal generator 109. In this embodiment, the signal action mechanism 111 includes a moving rod, one end of which extends into the second bellows 113, is fixedly connected to the first seal 118, and displaces with the deformation of the first bellows 103; The other end of the moving rod extends out of the second corrugated pipe 113, and is fixedly connected to an adjusting fixing piece. The outside of the adjusting fixing piece is provided with a number of adjusting screws 10101, which are correspondingly arranged with the corresponding signal generator 109. The gas density is monitored through the first sealing gas chamber G1 and the second sealing gas chamber G2, and the gas density is monitored in combination with the signal generator 109. When the gas density is lower than or/and higher than the set gas density, the gas density relay body 1 outputs an alarm or/and a blocking contact signal through the signal generator 109.

The driving contact actuating mechanism 15 is arranged in the housing 101 of the gas density relay body 1, above the signal actuating mechanism 111, and is configured to directly exert a force on the signal actuating mechanism 111 to drive the moving rod to move. The balance of the force exerted by the first sealing gas chamber G1 and the third gas chamber G3 on the upper end face of the first bellows 103 is broken, and the first bellows 103 is deformed with the movement of the moving rod, generating a certain displacement. The moving rod drives the adjusting screw 10101 to touch the button of the signal generator 109, and the signal generator 109 sends out alarm and blocking signals.

When the force transmitting element 152 (cam) does not apply force, under the action of the return spring 154, the push rod 153 is far away from the moving rod of the signal actuating mechanism 111, and the push rod 153 does not apply force to the moving rod of the signal actuating mechanism 111. When the force transmission part 152 (cam) applies force, the push rod 153 is affected by the driving part 151 and the force transmission part 152, and its force F on the return spring 154 can be obtained by detecting the shape variable of the return spring 154 through the force measuring sensor 16 (F=L*N, wherein, L is the shape variable, mm; N is the elastic coefficient, kg/mm). During check, the force transmitting part 152 rotates under the drive of the driving part 151 to push the push rod 153 downward, thereby applying force F to the spring 154 and the signal actuating mechanism 111, that is, the driving part 151 applies force to the signal actuating mechanism 111 through the force transmitting part 152, the adjusting screw 10101 on the signal actuating mechanism 111 pushes the signal generator 109, the contact of the signal generator 109 is connected, and the corresponding contact signal (alarm or blocking) is sent, Namely, the contact actuating mechanism 15 is driven to make the gas density relay body 1 generate contact signal action. The force measuring sensor 16 is arranged at the end of the push rod 153 towards the force transmitting member, or above or below the adjusting fixing member, and is relatively arranged with the adjusting fixing member.

Working Principle:

In the non-check state, the intelligent control unit 7 monitors the gas pressure and temperature of electrical equipment 8 according to the first pressure sensor 2 and temperature sensor 3, and obtains the corresponding 20° C. pressure value $P_{20}$ (i.e. gas density value), which can be remotely transmitted to online monitoring, that is, the intelligent control unit 7 obtains the gas density value collected by the first pressure sensor 2 and temperature sensor 3; Alternatively, the intelligent control unit 7 acquires the pressure value collected by the first pressure sensor 2 and the temperature value collected by the temperature sensor 3 to complete the online monitoring of the gas density of the monitored electrical equipment by the gas density relay. At this time, the gas density value of the first seal gas chamber G1 is greater than the gas density value of the third gas chamber G3, that is, the difference between the gas density value of the first seal gas chamber G1 and the gas density value of the third gas chamber G3 is greater than a certain set value. It can be seen from FIG. 4 that there is a corresponding distance between the adjusting screw 10101 of the signal action mechanism 111 and the signal generator 109. At this time, the adjusting screw 10101 does not contact the signal generator 109, that is, the signal generator 109 is not triggered, the function generator 109 does not operate, and its contact signal is not output.

When the density relay body 1 needs to be checked, the intelligent control unit 7 controls and drives the driving part 151 of the contact action mechanism 15 to drive the force transmitting part 152 to rotate, and the force transmitting part 152 rotates to drive the push rod 153 to move downward, thereby exerting a force F on the spring 154 and the signal action mechanism 111, that is, the driving part 151 exerts a force F on the moving rod of the signal action mechanism 111 through the force transmitting part 152, and the pressure acting on the upper end face of the first bellows 103 increases and drives the first bellows 103 downward to produce displacement and deformation. The moving rod moves downward to reduce the distance between the adjusting screw 10101 and the signal generator 109. When the distance is less than the corresponding value, the adjusting screw 10101 of the signal action mechanism 111 contacts the signal generator 109, which triggers the signal generator 109. The contact of the signal generator 109 acts (connects) and sends out the corresponding contact signal (alarm or lockout). The contact action is uploaded to the intelligent control unit 7 through the online check of the contact signal sampling unit 6. The intelligent control unit 7 acquires the pressure value P1 collected by the first pressure sensor 2, the temperature value T collected by the temperature sensor 3, and the force F collected by the force sensor 16 when the contact signal of the gas density relay body 1 acts or switches, and the force F is calculated or converted into the corresponding pressure value P2 according to the force F, The equivalent gas pressure P is calculated according to the pressure P1 and P2; The online check of the gas density relay is completed according to the equivalent gas pressure value P and the pressure value corresponding to 20° C. converted according to the gas pressure temperature characteristics, i.e. the gas density value $P_{20}$. Alternatively, the intelligent control unit 7 acquires the gas density value $P1_{20}$ collected by the first pressure sensor 2 and temperature sensor 3 when the contact signal of the gas density relay body 1 acts or switches, and the force F collected by the force measuring sensor 16. Combined with the temperature value T collected by the temperature sensor 3, the force F is calculated or converted into the corresponding gas density value $P2_{20}$, the gas density value $P_{20}$ is calculated according to the gas density value $P1_{20}$ and $P2_{20}$, and the online check of the gas density relay is completed. Further, when the contact signal of gas density relay body 1 acts or switches, its equivalent gas pressure value P=P1-P2; The online check of the gas density relay is completed according to the equivalent gas pressure value P and the pressure value corresponding to 20° C. converted according to the gas pressure temperature characteristic, i.e. the gas density value $P_{20}$; Alternatively, when the contact signal of gas density relay body 1 acts or switches, its equivalent gas pressure value P=P1-P2*M, wherein, M is the preset coefficient, which is obtained according to the characteristics of the gas density relay; The online check of the gas density relay is completed according to the equivalent gas pressure value P, temperature value T, and the pressure value corresponding to 20° C. converted according to the gas pressure temperature characteristics, i.e. the gas density value $P_{20}$. Alternatively, when the contact signal of the gas density relay body 1 acts or switches, the corresponding relationship between the gas density value $P_{20}$ and the gas density values $P1_{20}$, $P2_{20}$ can be designed into a data table in advance, and the corresponding gas density value $P_{20}$ can be obtained by querying the data table according to the gas density value $P1_{20}$ and the gas density value $P2_{20}$, thus completing the online check of the gas density relay; Alternatively, when the contact signal of the gas density relay body 1 acts or switches, the corresponding relationship between the gas density value $P_{20}$ and the gas pressure values P1, P2, and the temperature value T is designed into a data table, and the corresponding gas density value $P_{20}$ is obtained by querying the data table according to the gas pressure values P1, P2, and the temperature value T to complete the online check of the gas density relay. Repeat the check for many times (such as 2-3 times), and then calculate the average value, thus completing checking the gas density relay.

Then, the intelligent control unit 7 disconnects the contact sampling circuit of the gas density relay body 1. At this time, the contact of the gas density relay body 1 is not connected to the intelligent control unit 7. The control circuit of the gas density relay body 1 is connected through the intelligent control unit 7, the density monitoring circuit of the gas density relay body 1 works normally, and the gas density of the electrical equipment is monitored safely by the gas density relay body 1, so that the electrical equipment can work safely and reliably. In this way, it is convenient to complete the online check of gas density relay, and the safe operation of electrical equipment will not be affected when the gas density relay is checked online.

To sum up, the application provides a gas density relay with online self-check function and its check method for high-voltage and medium-voltage electrical equipment, including a gas density relay body, a first pressure sensor, a temperature sensor, a force measuring sensor, a driving contact actuating mechanism and an intelligent control unit. The driving contact action mechanism is configured to exert force on at least one main element of the gas density relay body, for example, to drive the end seat of the gas density relay body, or the pressure detection element, or the movement, etc. to displace the signal action mechanism, so that the gas density relay body has contact signal action; Alternatively, the driving contact action mechanism directly drives the signal action mechanism of the gas density relay body to displacement, so that the gas density relay body can perform contact signal action. The force measuring sensor is connected or associated with at least one main element driving the contact action mechanism or the gas density relay body to detect the force exerted by the force applying mechanism on the main elements of the bulk density relay body. Here, the main elements can include: pressure detection element, end seat, temperature compensation element, signal generator, signal action mechanism, movement, and pointer. Alternatively, at least one diagnostic sensor can be set on the gas density relay body to collect the corresponding position, and/or corresponding displacement, and/or corresponding shape variable of at least one of the main elements of the gas density relay body. According to the gas pressure during monitoring and the force exerted by the driving contact action mechanism, judge whether the data monitored by the diagnostic sensor meets the preset requirements, so as to diagnose whether the current working state of the gas density relay body is normal. When the contact acts, the intelligent control unit detects the alarm and/or blocking contact signal action value and/or return value of the gas density relay body according to the density value when the contact acts. Checking the gas density relay can be completed without the maintainer coming to the site, which improves the reliability of the power grid, improves the work efficiency, reduces the operation and maintenance cost, and implements the maintenance free of the gas density relay. At the same time, the whole check process achieved zero discharge of SF6 gas, meeting the requirements of environmental protection regulations. Most importantly, due to the technical innovation of the invention, the driving contact actuating mechanism is not connected to the gas density relay body or the main gas path of SF6 of electrical equipment, which can greatly improve the reliability of the power grid, reduce its sealing requirements, reduce the manufacturing cost, and improve the convenience and flexibility of on-site installation. The application implements online check of gas density relay, thus implementing intelligent management of the whole life cycle of gas density relay: only repair if there is a problem, and no operation and maintenance service if there is no problem.

It should be noted that a gas density relay with online self-check function generally means that its components are designed into an integrated structure; The gas density monitoring device generally refers to its component design, component structure and flexible composition. The gas density relay can use the original gas density relay of the substation for technical transformation and upgrading.

The above specific embodiments of the invention have been described in detail, but they are only Embodiment s, and the invention is not limited to the above specific embodiments. For those skilled in the art, any equivalent modification and substitution of the invention are also included in the scope of the invention. Therefore, the equal transformation and modification made without departing from the spirit and scope of the invention should be included in the scope of the invention.

The invention claimed is:

1. A gas density relay with the function of online self-check, comprising a gas density relay body, a first pressure sensor, a temperature sensor, a force measuring sensor, a driving contact action mechanism and a control unit; wherein
   the gas density relay body comprises a shell, a pressure detection element, a temperature compensation element, a signal generator and a signal action mechanism arranged in the shell;
   the first pressure sensor is connected to the pressure detection element of the gas density relay body;
   the driving contact action mechanism is arranged inside or outside the shell, and includes a force application mechanism and a motion mechanism, the force application mechanism includes a driving component and a force transmission component driven by the driving component, the motion mechanism includes a push rod, which moves under the drive of the force application mechanism, directly or indirectly displaces the signal action mechanism to trigger the signal generator to generate contact signal action;
   the force measuring sensor, which is arranged on the driving contact action mechanism or in the shell, is configured to detect the force exerted by the driving contact action mechanism on the gas density relay body;
   the control unit is respectively connected to the driving contact action mechanism, the first pressure sensor, the temperature sensor and the force measuring sensor, and is configured to control the driving contact action mechanism, to acquire pressure values, temperature values, and gas density values, and to detect the contact signal action value and/or contact signal return value of the gas density relay body;
   wherein, the contact signals include alarm signals or blocking signals.

2. The gas density relay with online self-check function as claimed in claim 1, wherein the signal generator includes a microswitch or a magnetic assisted electrical contact, and the gas density relay body outputs the contact signal through the signal generator; the temperature compensation element adopts a bimetallic sheet or a gas enclosed in the shell; the pressure detecting element comprises a bourdon tube or a corrugated tube.

3. The gas density relay with online self-check function as claimed in claim 1, wherein the force measuring sensor includes one of pressure sensor, magnetic sensor, displacement sensor, photoelectric sensor, angle sensor and camera.

4. The gas density relay with online self-check function as claimed in claim 1, wherein the driving component includes one selected from: magnetic drive mechanism, motor, reciprocating mechanism, air compressor, compressor, vent valve, pressure pump, booster pump, booster valve, electric air pump, electromagnetic air pump, pneumatic component, magnetic coupling thrust mechanism, heating thrust mechanism, electric heating generated thrust mechanism, and chemical reaction generated thrust mechanism.

5. The gas density relay with online self-check function as claimed in claim 1, wherein the force transmitting member includes one of cam, connecting rod, spring, metal piece, non-metal piece, expansion piece and non-expansion piece.

6. The gas density relay with online self-check function as claimed in claim 1, wherein the force measuring sensor is arranged on the push rod driving the contact action mechanism; alternatively,
   the force measuring sensor is arranged on the pressure detecting element; alternatively,
   the force measuring sensor is arranged on the temperature compensation element; and alternatively,
   the force measuring sensor is arranged on the signal action mechanism.

7. The gas density relay with online self-check function as claimed in claim 1, wherein the gas density relay body also includes a base, an end seat and a movement arranged in the shell; the movement is fixed on the base; the pressure detection element is a bourdon tube filled with sealing gas, one end of which is fixed on the base and connected to it, the other end is connected to one end of the temperature compensation element through the end seat, and the other end of the temperature compensation element is provided with a signal action mechanism; the signal action mechanism is provided with an adjusting screw or trigger to push the signal generator and make the contact of the signal generator connected or disconnected, and the gas density relay body outputs the contact signal through the signal generator; the driving contact actuating mechanism is arranged outside the shell of the gas density relay body, the driving contact actuating mechanism also includes a cover with an opening, the cover is fixedly connected to the shell, and the opening faces the shell, and the driving component, power transmission component and push rod are arranged inside the cover; or, the driving contact action mechanism is arranged in the shell of the gas density relay body.

8. The gas density relay with online self-check function as claimed in claim 7, wherein one end of the push rod towards the force application mechanism is provided with a fixing piece, the fixing piece is fixed in the cover, and the other end of the push rod penetrates through a fixing frame fixed at the opening of the cover, the push rod penetrates the end of the fixed frame and extends into the shell from the air hole on the shell of the gas density relay body; the end seat in the shell is provided with an end seat contact plate, and the push rod extends into the end of the shell and is relatively arranged with the end seat contact plate; the force sensor is connected to the push rod through a contact, or the force sensor is directly connected to the push rod.

9. The gas density relay with online self-check function as claimed in claim 7, wherein one end of the push rod towards the force application mechanism passes through a fixed frame, the fixed frame is fixedly arranged on the shell of the gas density relay body, and after one end of the push rod far away from the force application mechanism extends from the opening of the housing cover, it extends into the shell through the air hole on the shell of the gas density relay body; the end part of the push rod extending into the shell is relatively arranged with the pressure detecting element in the shell; the force sensor contacts the pressure detection element through a contact piece, or the force sensor directly contacts the pressure detection element.

10. The gas density relay with online self-check function as claimed in claim 7, wherein the movement comprises a sector gear and a central gear, the first end of the sector gear is engaged with the central gear, and the second end of the sector gear is connected to the other end of the temperature compensation element through a connecting rod or directly; The second end of the sector gear is fixedly connected to one end of the sector gear contact, and the other end of the sector gear contact extends out of the shell from the air hole of the shell of the gas density relay body, and is opposite to the end of the push rod driving the contact action mechanism away from the force application mechanism.

11. The gas density relay with online self-check function as claimed in claim 1, wherein the gas density relay body includes a first corrugated pipe arranged in the shell as a pressure detection element, and also includes a second corrugated pipe, the first open end of the first corrugated pipe is fixed on the inner wall of the shell, and the second open end of the first corrugated pipe is sealed with the first sealing element, the inner wall of the first corrugated pipe, the first sealing element and the inner wall of the shell form a first sealing gas chamber, and the first sealing gas chamber is provided with an interface connecting with the insulating gas of the electrical equipment; the first open end of the second corrugated pipe is sealed with the first sealing element, the second open end of the second corrugated pipe is connected to the inner wall of the shell through the second sealing element, the outer wall of the first corrugated pipe, the first sealing element, the outer wall of the second corrugated pipe, the second sealing element and the inner wall of the shell form a second sealing gas chamber, and the second sealing gas chamber is filled with standard compensation gas, constituting a temperature compensation element; the inner wall of the second corrugated pipe, the second sealing element and the inner wall of the shell form a third gas chamber together, the signal generator and signal action mechanism are arranged in the third gas chamber, the signal action mechanism is connected to the first sealing element, the signal generator is arranged corresponding to the signal action mechanism; the driving contact actuating mechanism is arranged in the shell of the gas density relay body, one end of the push rod close to the force transmitting part is provided with a fixing piece, and the end of the push rod far away from the force transmitting part penetrates through a fixing frame fixed on the inner wall of the shell, and extends to the lower side of the fixing frame to be relatively arranged with the signal actuating mechanism.

12. The gas density relay with online self-check function as claimed in claim 11, wherein the outer diameter of the first bellows is greater than the outer diameter of the second bellows; the signal action mechanism comprises a moving rod, one end of the moving rod extends into the second corrugated pipe, is connected to the first sealing element, and generates displacement with the deformation of the first corrugated pipe; the other end of the moving rod extends out of the second corrugated pipe and is fixedly connected to an adjusting fixing piece, the adjusting fixing piece is provided with an adjusting screw, which is used to touch the signal generator under the driving force of the moving rod.

13. The gas density relay with online self-check function as claimed in claim 11, wherein the force measuring sensor is located at one end of the push rod toward the force transmitting part, or the force measuring sensor is located at one end of the push rod toward the force transmitting part.

14. The gas density relay with online self-check function as claimed in claim 1, wherein the gas density relay also includes an online check contact signal sampling unit which is respectively connected to the signal generator and the control unit of the gas density relay body and configured to sample the contact signal of the gas density relay body;

the online check contact signal sampling unit includes an isolation sampling element, which is controlled by the gas density relay body, or the driving contact action mechanism, or the control unit; in the non-check state, the online check contact signal sampling unit is isolated from the contact signal of the gas density relay body on the circuit by the isolation sampling element; in the check state, the online check contact signal sampling unit cuts off the contact signal control circuit of the gas density relay body through the isolation sampling element, and connects the contact of the gas density relay body with the control unit; wherein, the isolation sampling element includes one of the travel switch, micro-switch, button, electric switch, displacement switch, electromagnetic relay, optocoupler and thyristor.

15. The gas density relay with online self-check function as claimed in claim 14, wherein the gas density relay also includes a multichannel joint, one or more of the gas density relay body, the first pressure sensor, the driving contact action mechanism, the online check contact signal sampling unit, the control unit and the temperature sensor are arranged on the multichannel joint.

16. The gas density relay with online self-check function as claimed in claim 1, wherein the control of the control unit is controlled through on-site control and/or background control.

17. The gas density relay with online self-check function as claimed in claim 1, wherein the shell of the gas density relay body is also provided with a display mechanism for displaying the density of insulating gas.

18. A check method for gas density relay with online self-check function as claimed in claim 1, wherein the check method comprises the following steps:

in normal working state, the gas density relay monitors the gas density value in electrical equipment;

the gas density relay is allowed to check the gas density relay body according to the set check time or/and check command and the gas density value:

the control unit drives and drives the contact action mechanism, so that the motion mechanism driving the contact action mechanism exerts force on the elements in the gas density relay body under the drive of the force application mechanism, so that the signal action mechanism of the gas density relay body moves, and triggers the signal generator to generate contact signal action; the control unit acquires the pressure value P1 and the temperature value T collected by the first pressure sensor and the force F collected by the force sensor when the contact signal of the gas density relay body acts or switches, calculates or converts the force F into the corresponding pressure value P2, and calculates the equivalent gas pressure value P according to the pressure value P1 and the pressure value P2; the online check of the gas density relay is completed according to the equivalent gas pressure value P and the pressure value corresponding to 20° C. converted according to the gas pressure temperature characteristic; or, the control unit obtains the gas density value $P1_{20}$ collected by the first pressure sensor and temperature sensor when the contact signal of the gas density relay body is activated or switched, and the force F collected by the force measuring sensor, combined with the temperature value T collected by the temperature sensor, the control unit obtains the corresponding gas density value $P2_{20}$ through calculation or conversion, and calculates the gas density value $P_{20}$ according to the gas density value $P1_{20}$ and the gas density value $P2_{20}$, completing the online check of the gas density relay; or, the control unit acquires the pressure value P1 collected by the first pressure sensor, the temperature value T collected by the temperature sensor, and the force F collected by the force measuring sensor when the contact signal of the gas density relay body acts or switches, calculates the corresponding gas density value $P_{20}$ according to the pressure values P1, T, and F, and completes the online check of the gas density relay;

when all the contact signals are checked, the control unit restores the driving contact action mechanism.

19. The check method for gas density relay with online self-check function as claimed in claim 18, wherein the gas density relay also includes an online check contact signal sampling unit, the online check contact signal sampling unit is respectively connected to the signal generator and control unit of the gas density relay body, and is configured to sample the contact signal of the gas density relay body; the check method includes:

under normal working condition, the gas density relay monitors the gas density value in the electrical equipment, and the gas density relay monitors the gas density value in the electrical equipment online through the first pressure sensor, temperature sensor and control unit;

the gas density relay is allowed to check the gas density relay body according to the set check time or/and check command and the gas density value;

the online check contact signal sampling unit is adjusted to the check state through the control unit, in the check state, the online check contact signal sampling unit cuts off the control circuit of the contact signal of the gas density relay body, and connects the contact of the gas density relay body to the control unit;

the control unit drives the contact actuation mechanism, so that the motion mechanism of the contact actuation mechanism exerts force on the elements in the gas density relay body under the drive of the force application mechanism, so that the signal actuation mechanism of the gas density relay body is displaced, and the signal generator is triggered to generate contact signal actuation; the control unit acquires the pressure value P1 collected by the first pressure sensor and the temperature value T collected by the temperature sensor when the contact signal of the gas density relay body acts or switches, and the force F collected by the force sensor, calculates or converts it into the corresponding pressure value P2 according to the force F, and calculates the equivalent gas pressure value P according to the pressure value P1 and the pressure value P2; according to the equivalent gas pressure value P and the pressure value corresponding to 20° C. converted according to the gas pressure-temperature characteristic, the online check of the gas density relay is completed; or, the control unit obtains the gas density value $P1_{20}$ collected by the first pressure sensor and the temperature sensor when the contact signal of the gas density relay body acts or switches, and the force F collected by the force measuring sensor, combined with the temperature value T collected by the temperature sensor, the control unit calculates or converts it into the corresponding gas density value $P2_{20}$, and calculates the gas density value $P_{20}$ according to the gas density value $P1_{20}$ and the gas density value $P2_{20}$, completing the online check of the gas density relay; or, the control unit acquires the pressure value P1 collected by the first pressure sensor, the temperature value T collected by the temperature sensor, and the force F collected by the force measuring sensor when the contact signal of the gas density relay body acts or switches, and calculates the corresponding gas density value $P_{20}$ according to the pressure values P1, T, and F to complete the online check of the gas density relay;

when all the contact signal check work is completed, the control unit restores the driving contact action mechanism, adjusts the online check contact signal sampling unit to the working state, and the control circuit of the contact signal of the gas density relay body returns to the normal working state.

20. The check method for gas density relay with online self-check function as claimed in claim 18, wherein the method comprises the following step:

when the contact signal of the gas density relay body acts or switches, its equivalent gas pressure value P=P1−P2; the online check of the gas density relay is completed according to the equivalent gas pressure value P and the pressure value corresponding to 20° C. converted according to the gas pressure temperature characteristic; or when the contact signal of the gas density relay body acts or switches, its equivalent gas pressure value P=P1−P2*K; wherein, K is the preset coefficient; the online check of the gas density relay is completed according to the equivalent gas pressure value P, temperature value T, and the pressure value corresponding to 20° C. converted according to the gas pressure temperature characteristics; or, when the contact signal of the gas density relay body acts or switches, the corresponding relationship between the gas density value $P_{20}$ and the gas density values $P1_{20}$, $P2_{20}$ is predesigned into a data table, and the corresponding gas density value $P_{20}$ is obtained by querying the data table according to the gas density value $P1_{20}$ and the gas density value $P2_{20}$, thus completing the online check of the gas density relay; or, when the contact signal of the gas density relay body acts or switches, the corresponding relationship between the gas density value $P_{20}$ and the gas pressure values P1, P2, and the temperature value T is designed into a data table in advance, and the corresponding gas density value $P_{20}$ is obtained by querying the data table according to the gas pressure values P1, P2, and the temperature value T to complete the online check of the gas density relay; or, when the contact signal of the gas density relay body acts or switches, the corresponding relationship between the gas density value $P_{20}$ and the gas pressure value P1, the force F and the temperature value T collected by the force measuring sensor is predesigned into a data table, and the corresponding gas density value $P_{20}$ is obtained by querying the data table according to the gas pressure value P1, the force F and the temperature value T collected by the force measuring sensor, the online check of the gas density relay is completed.

* * * * *